United States Patent
Chuang et al.

(10) Patent No.: US 8,368,170 B2
(45) Date of Patent: Feb. 5, 2013

(54) REDUCING DEVICE PERFORMANCE DRIFT CAUSED BY LARGE SPACINGS BETWEEN ACTIVE REGIONS

(75) Inventors: Harry-Hak-Lay Chuang, Singapore (SG); Kong-Beng Thei, Hsin-Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/367,103

(22) Filed: Feb. 6, 2012

(65) Prior Publication Data

US 2012/0132987 A1     May 31, 2012

Related U.S. Application Data

(60) Continuation of application No. 13/155,251, filed on Jun. 7, 2011, now Pat. No. 8,115,271, which is a division of application No. 12/175,976, filed on Jul. 18, 2008, now Pat. No. 7,977,202.

(60) Provisional application No. 61/050,064, filed on May 2, 2008.

(51) Int. Cl.
       *H01L 21/70*          (2006.01)
(52) U.S. Cl. ........ 257/506; 257/510; 257/520; 257/649; 257/401; 257/E29.02; 438/407; 438/433; 438/434; 438/449
(58) Field of Classification Search .................. 257/506, 257/510, 520, 649, 401, E29.02; 438/407, 438/433, 434, 449
See application file for complete search history.

(56) References Cited

U.S. PATENT DOCUMENTS

| | | | |
|---|---|---|---|
| 6,284,626 B1 | 9/2001 | Kim | |
| 6,875,053 B2 | 4/2005 | Fujii et al. | |
| 6,984,564 B1 | 1/2006 | Huang et al. | |
| 7,109,443 B2 | 9/2006 | Knutson et al. | |
| 7,119,404 B2 | 10/2006 | Chang et al. | |
| 7,164,163 B2 | 1/2007 | Chen et al. | |
| 7,232,730 B2 | 6/2007 | Chen et al. | |
| 2005/0127474 A1* | 6/2005 | Matsuda | 257/510 |
| 2006/0226490 A1 | 10/2006 | Burnett et al. | |
| 2007/0105336 A1 | 5/2007 | Takeoka et al. | |
| 2008/0150037 A1 | 6/2008 | Teo et al. | |
| 2009/0057809 A1 | 3/2009 | Richter et al. | |
| 2009/0140345 A1* | 6/2009 | Zhu | 257/369 |
| 2011/0233682 A1 | 9/2011 | Chuang et al. | |

* cited by examiner

*Primary Examiner* — Tu-Tu Ho
(74) *Attorney, Agent, or Firm* — Slater & Matsil, L.L.P.

(57) ABSTRACT

A method of forming an integrated circuit structure includes providing a semiconductor substrate; and forming a first and a second MOS device. The first MOS device includes a first active region in the semiconductor substrate; and a first gate over the first active region. The second MOS device includes a second active region in the semiconductor substrate; and a second gate over the second active region. The method further include forming a dielectric region between the first and the second active regions, wherein the dielectric region has an inherent stress; and implanting the dielectric region to form a stress-released region in the dielectric region, wherein source and drain regions of the first and the second MOS devices are not implanted during the step of implanting.

17 Claims, 9 Drawing Sheets

REDUCING DEVICE PERFORMANCE DRIFT CAUSED BY LARGE SPACINGS BETWEEN ACTIVE REGIONS

This application is a continuation of U.S. patent application Ser. No. 13/155,251, filed on Jun. 7, 2011, and entitled "Reducing Device Performance Drift Caused by Large Spacings Between Active Regions;" which application further claims the benefit of U.S. patent application Ser. No. 12/175,976, filed on Jul. 18, 2008, and entitled "Reducing Device Performance Drift Caused by Large Spacings Between Active Regions;" which application further claims the benefit of U.S. Provisional Patent Application Ser. No. 61/050,064, filed on May 2, 2008, and entitled "Reducing Device Performance Drift Caused by Large Spacings Between Active Regions," which applications are hereby incorporated herein by reference.

TECHNICAL FIELD

This invention relates generally to integrated circuits, and more particularly to metal-oxide-semiconductor (MOS) devices, and even more particularly to reducing the performance drift caused by the difference in stresses applied on the MOS devices.

BACKGROUND

It is well known that the drive currents of metal-oxide-semiconductor (MOS) devices are affected by the stresses applied on the channel regions of the MOS devices. The stresses in the channel regions may improve the carrier mobility. Generally, it is desirable to induce a tensile stress in the channel region of an n-type MOS (NMOS) device in a source-to-drain direction (channel length direction) and to induce a compressive stress in the channel region of a p-type MOS (PMOS) device in the channel length direction.

Although the beneficial stresses in the channel regions are generally desirable, it is also realized that the magnitudes of the drive current improvement is related to the magnitudes of the stresses. On a same semiconductor chip, the MOS devices may be applied with stresses having different magnitudes. Accordingly, the drive current improvements for different MOS devices may be different, resulting in non-uniform drive currents, hence drive current drift.

It is preferred that the performances of MOS devices are predictable, so that at circuit design time, simulations that accurately reflect the circuit behavior may be performed. Accordingly, it is preferred that in a semiconductor chip, MOS devices of a same type and in a same type of circuits have a uniform performance. However, with the drive current drift, during the simulations of the circuit design, the drive current drift has to be compensated for. What makes the compensation of the drive current drift complicated is that the stresses of MOS device are affected by various factors and those factors behave differently for different layouts. Accordingly, new methods for reducing the drive current drift of MOS devices are needed.

SUMMARY OF THE INVENTION

In accordance with one aspect of the present invention, a method of forming an integrated circuit structure includes providing a semiconductor substrate; and forming a first and a second MOS device. The first MOS device includes a first active region in the semiconductor substrate; and a first gate over the first active region. The second MOS device includes a second active region in the semiconductor substrate; and a second gate over the second active region. The method further include forming a dielectric region between the first and the second active regions, wherein the dielectric region has an inherent stress; and implanting the dielectric region to form a stress-released region in the dielectric region, wherein source and drain regions of the first and the second MOS devices are not implanted during the step of implanting.

In accordance with another aspect of the present invention, a method of forming an integrated circuit structure includes providing a semiconductor chip including a semiconductor substrate; forming a hard mask over the semiconductor substrate; forming an opening in the mask to expose a portion of the semiconductor substrate; forming a field region in the opening, wherein the field region adjoins an active region of the semiconductor substrate; implanting a top portion of the field region to form a stress-released region in the dielectric region; and after the step of implanting, forming a gate electrode over the active region.

In accordance with yet another aspect of the present invention, a method of forming an integrated circuit structure includes providing a semiconductor chip including a semiconductor substrate; forming a field region in the semiconductor chip, wherein the field region is between and adjoining a first and a second active region in the semiconductor substrate; forming a first MOS device comprising forming a first gate over the first active region; forming a second MOS device including forming a second gate over the second active region; forming a dielectric stressed layer including a first portion over the first gate and the first active region, and a second portion over the second gate and the second active region; and implanting an upper portion of the dielectric stressed layer to form a stress-released region in the dielectric stressed layer. The upper portion of the dielectric stressed layer is horizontally between the first and the second active regions. A lower portion of the dielectric stressed layer directly underlying the upper portion is not implanted during the step of implanting.

In accordance with yet another aspect of the present invention, an integrated circuit structure includes a semiconductor substrate; a first and a second active region in the semiconductor substrate, wherein the first and the second active regions have a first spacing; and a field region between and adjoining the first and the second active regions. A top central portion of the field region is a stress-released region doped with an element. A lower portion and top edge portions of the field region are substantially free from the element.

In accordance with yet another aspect of the present invention, an integrated circuit structure includes a semiconductor substrate including a first active region and a second active region, wherein the first and the second active regions have a first spacing; a field region between, and adjoining, the first and the second active regions; a first MOS device including a first gate over the first active region; a second MOS device including a second gate over the second active region; and a dielectric stressed layer including a first portion over the first gate and the first active region, and a second portion over the second gate and the second active region. The dielectric stress layer includes a top central portion directly over the field region, wherein the top central portion is doped with an element; a lower central portion directly underlying the top central portion, wherein the lower central portion is substantially free from the element; and portions directly over the first and the second active regions substantially free from the element.

The advantageous features of the present invention include reduced device performance drift, and hence there is no longer the need for compensate for the performance drift during circuit simulations.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for reducing the drive current drift of metal-oxide-semiconductor (MOS) devices, and the resulting MOS device structures, are provided. The intermediate stages of manufacturing exemplary embodiments of the present invention are illustrated. Throughout the various views and illustrative embodiments of the present invention, like reference numbers are used to designate like elements.

Figure 1A:
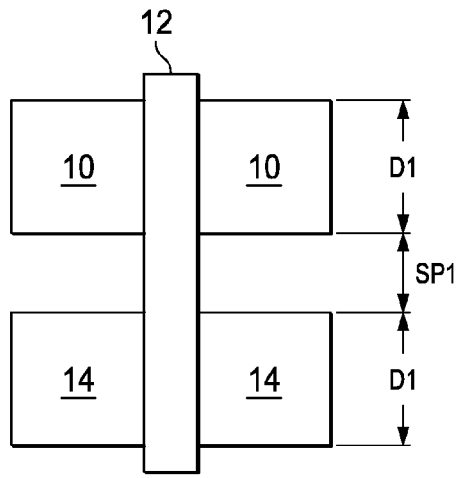
FIGS. 1A and 1B illustrate neighboring metal-oxide-semiconductor (MOS) devices spaced apart by spacings.
Figure 1B:
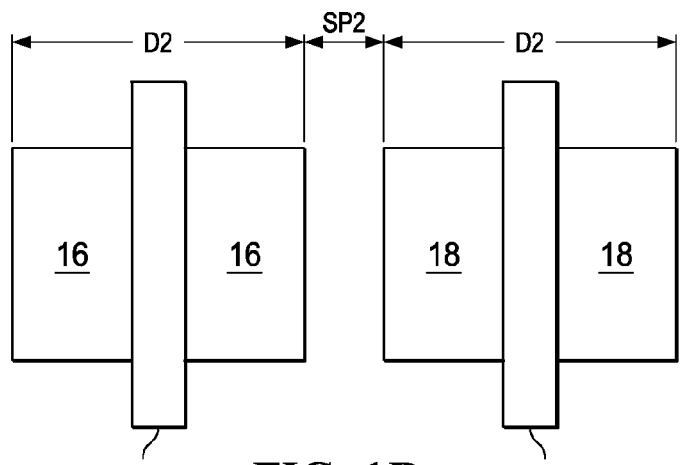
Figure 1C:
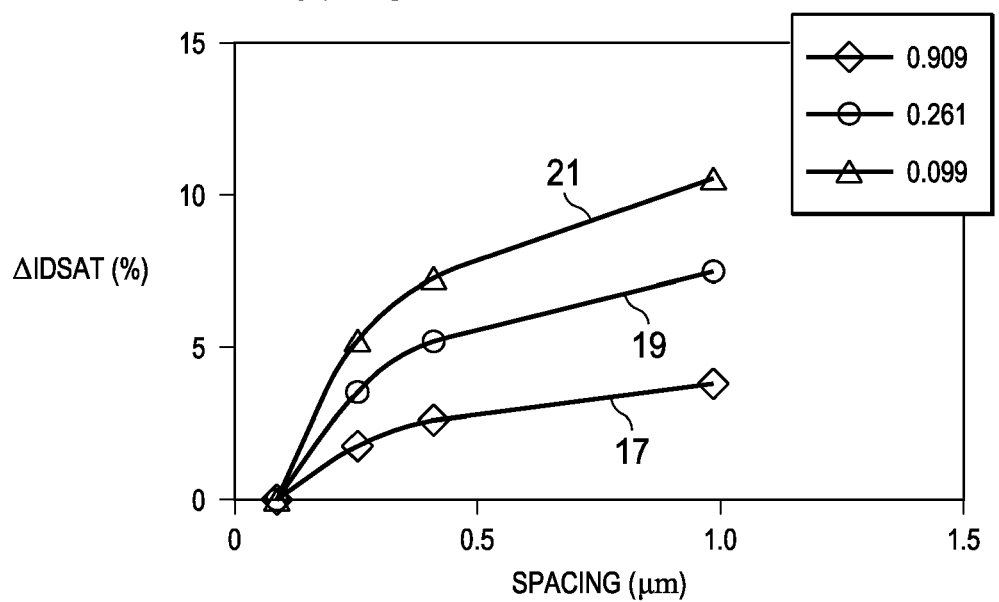
FIGS. 1C and 1D show the drive current drift of MOS devices as a function of the spacings between neighboring MOS devices.

FIG. 1A illustrates two neighboring MOS devices. The first MOS device includes active region 10 and gate electrode strip 12 over active region 10. The second MOS device includes active region 14 and gate electrode strip 12 over active region 14. Active regions 10 and 14 are spaced apart by spacing SP1. Experiments were performed to study the effect of spacing SP1 to the performance of the neighboring MOS devices. The results are shown in FIG. 1C, wherein the X-axis represents the spacing SP1, and the Y-axis represents the drive current drift (ΔIdsat, normalized to the drive current of MOS devices having spacing SP1 equal to 0). Lines 17, 19, and 21 were obtained, each corresponding to one of the active region dimensions D1 (refer to FIG. 1). It is noted that the drive current drift (ΔIdsat) has a direct correlation to the spacing SP1. When spacing SP1 increases, the drive current drift ΔIdsat also increases. It is also noted that the drive current drift ΔIdsat becomes significant when the spacing SP1 is greater than about 0.4 μm.

Figure 1D:
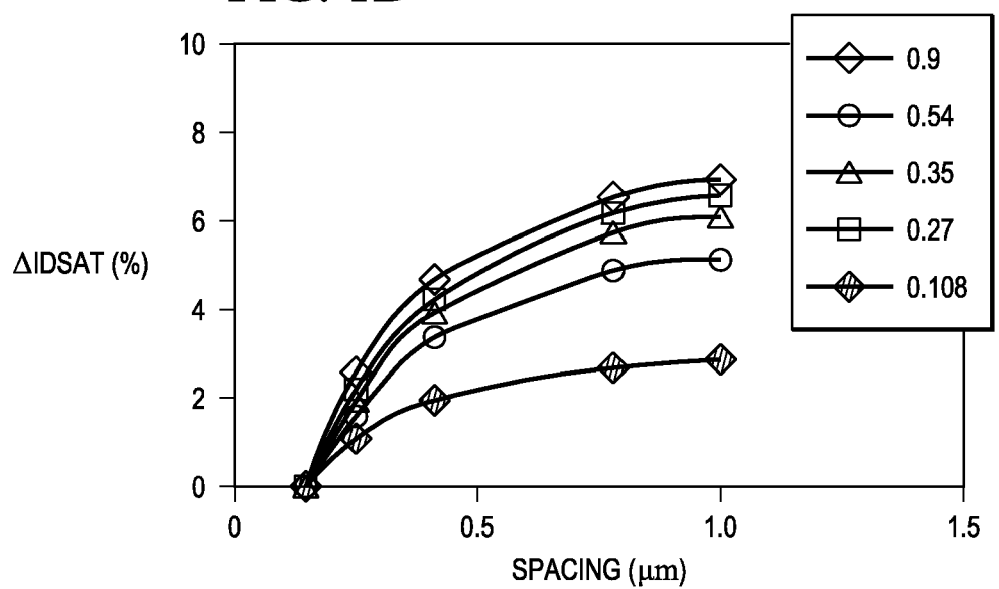

The spacing SP1 shown in FIGS. 1A and 1C are in the gate width direction. FIGS. 1B and 1D illustrate that the spacing SP2 in the gate length direction also affects the drive current of MOS device. Referring to FIG. 1B, two MOS devices are laid out side by side. The first MOS device includes active region 16 and gate electrode strip 20 over active region 16. The second MOS device includes active region 18 and gate electrode strip 22 over active region 18. Experiments were also performed to study the effect of spacing SP2 to the performance of the neighboring MOS devices. The results are shown in FIG. 1D, wherein the X-axis represents the spacing SP2, while the Y-axis represents the drive current drift (ΔIdsat, normalized to the drive current of MOS devices having spacing SP2 equal to 0). A plurality of lines was obtained, each corresponding to one of the active region dimension D2. It is noted that the drive current drift (ΔIdsat) is related to the spacing SP2. When spacing SP2 increases, the current drift ΔIdsat also increases. It is also noted that the drive current drift ΔIdsat becomes significant when the spacing SP2 is greater than about 0.25 μm.

It is realized that in a semiconductor chip, there will be a plurality of MOS devices, with different spacings SP1 and SP2 (which may vary in a big range) in different combinations. For each of the MOS devices, the respective spacings SP1 and SP2 affect its performance. Accordingly, in a semiconductor chip, the drive current drifts of the MOS devices may vary significantly. It is very hard to compensate for such drive current drifts in circuit simulations. Particularly, the variations in the spacings affect the stresses generated by STI regions, dielectric etch stop layers (DESL, also commonly known as contact etch stop layers, or CESL), stress memorization layers, and the like. It is even harder to predict and compensate for the drive current drifts in circuit simulations. Embodiments of the present invention are thus used to reduce such variation in the stresses.

Figure 2A:
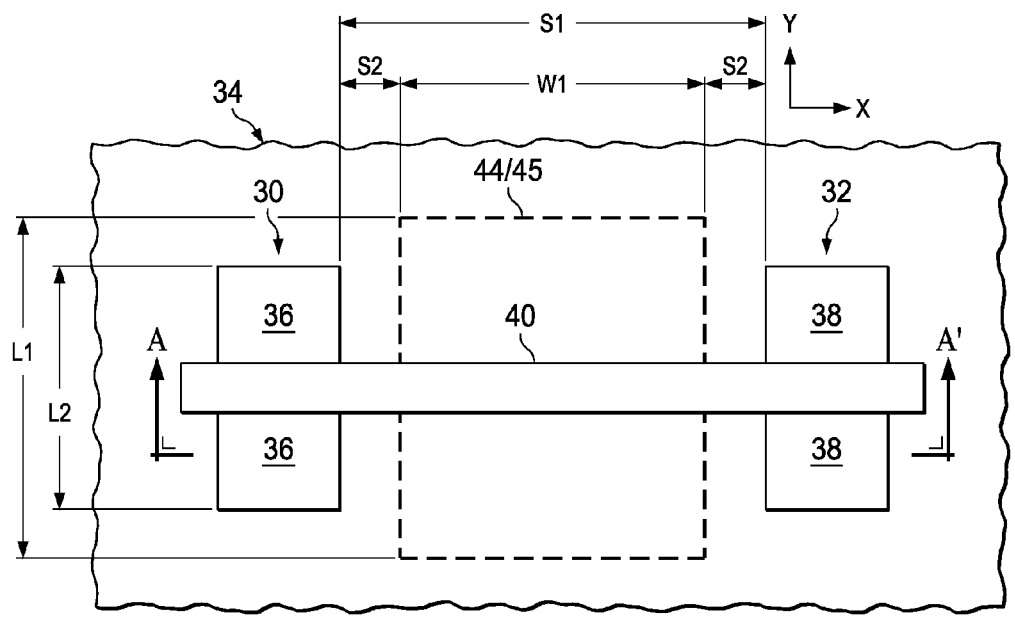
FIGS. 2A through 3 are embodiments of the present invention, wherein stress-released regions are formed in field regions between MOS devices.

FIG. 2A illustrates an embodiment of the present invention. In this embodiment, active regions 36 and 38, which belong to a semiconductor chip, are spaced apart by spacing S1, wherein the spacing S1 is filled with isolation region 34. In an embodiment, isolation region 34 (alternatively referred to as field regions) comprises field oxide, for example, thermal silicon oxide formed of local oxidation of silicon (LOCOS). In other embodiments, isolation region 34 is a shallow trench isolation (STI) region, which may include silicon oxide, silicon nitride, and/or the like. Isolation region 34 may also be extended to encircle one or both of the active regions 36 and 38. Gate electrode strip 40 extends over active regions 36 and 38 and isolation region 34 to form MOS devices 30 and 32, respectively.

In an embodiment, a first portion of STI region 34 within the region 44 (marked with dashed lines) is implanted, while the second portion of STI region 34 outside region 44 is not implanted. The implantation is preferably performed before the formation of gate electrode strip 40 and the formation of source and drain regions in active regions 36 and 38. The spacing S2 between the edges of region 44 and the respective edges of active regions 36 and 38 is preferably small enough, so that the variations in the drive currents of the MOS devices are not significant (refer to FIG. 1D). In an exemplary embodiment, spacing S2 is less than about 100 Å. One skilled in the art will realize, however, that the dimensions recited throughout the description are merely examples, and will change if different formation technologies are used. In the gate length direction (Y direction), length L1 is preferably greater than about 80 percent of length L2 of active regions 36 and/or 38, and more preferably greater than length L2.

The implantation has the effect of relaxing (releasing) the stress in the implanted portion 45 (refer to FIG. 7, referred to as stress-released region 45 hereinafter) of STI region 34, wherein the boundaries of stress-released region 45 is defined by region 44. The relaxing effect is partially caused by the break of the bonds of the STI materials, for example, oxides, in STI region 34. Accordingly, the stress-released region 45 applies much smaller stress (in the channel-width-direction, or X direction), if at all, to the MOS devices 30 and 32 than the unimplanted regions (referred to as stressed STI portions/regions hereinafter) of STI region 34. On the other hand, the stressed portions of STI region 34 continue to have inherent stresses, and apply stresses to MOS devices 30 and 32.

It is realized that a semiconductor chip includes multiple MOS devices, wherein the spacings S1 between neighboring MOS devices may be different from each other. To achieve uniform drive currents throughout the semiconductor chip, the widths W1 of the stress-released region 45 are preferably such determined that spacings S2 are uniform throughout the semiconductor substrate. In other words, if spacings S1 are greater, the width W1 of the stress-released regions 45 (also refer to FIG. 7) will also be greater. However, the values (S1-W1) are preferably uniform throughout the semiconductor chip (or at least throughout a stress-sensitive integrated circuit, such as analog circuit, standard cell circuit, and the like). With substantially uniform spacings S2 throughout the chip, the stresses applied by the STI regions to the MOS devices are substantially uniform. Accordingly, the drive current changes caused by the STI regions are uniform, and hence the drive current drift between MOS devices is reduced.

In alternative embodiments, all STI regions 34 throughout the semiconductor chip/wafer are implanted. In these embodiments, the stresses applied by the STI regions are substantially eliminated, and hence the drive current drift between the MOS devices is substantially eliminated.

Figure 2B:
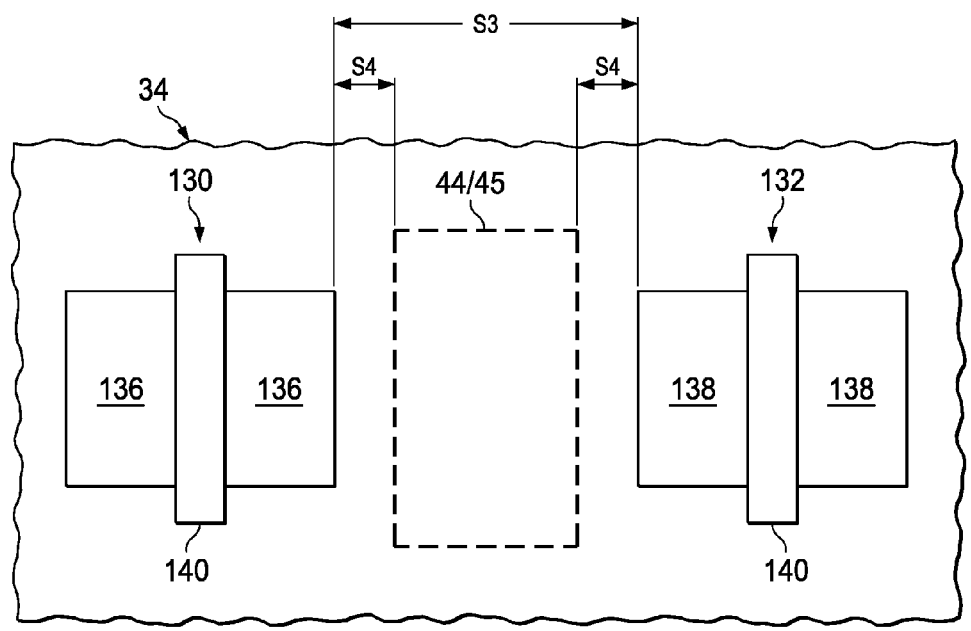

FIG. 2B illustrates an alternative embodiment of the present invention, wherein MOS devices 130 and 132, instead of sharing a common gate electrode strip, have two parallel gate electrode strips 140, and two parallel active regions 136 and 138 having spacing S3. Similarly, stress-released region 45 is formed in STI region 34 to reduce the drive current drifts of MOS devices 130 and 132. Also, throughout a stress-sensitive integrated circuit or a semiconductor chip, spacings S4 between MOS devices are preferably uniform. The formation of stress-released region 45 reduces the channel-length-direction stresses in the channel regions (underlying gate strips 140) of MOS devices 130 and 132. The dimensions of region 45 are determined based on essentially the same principle for the embodiment shown in FIG. 2A.

Figure 3:
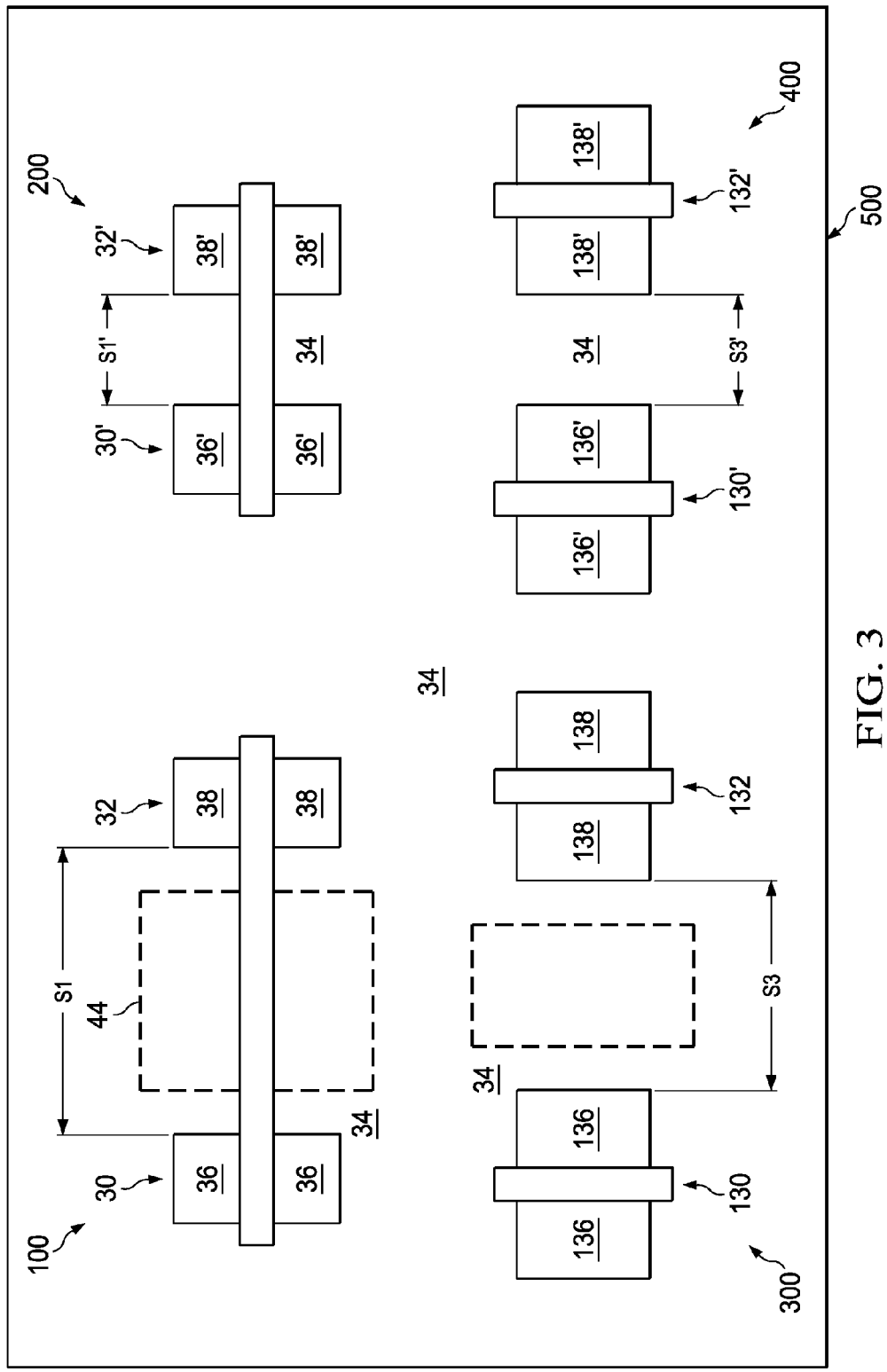

FIG. 3 illustrates a top view of a semiconductor chip 500, which includes four device regions 100, 200, 300, and 400. The first device region 100 includes essentially the same semiconductor structure as shown in FIG. 2A, in which the active regions 36 and 38 have a first spacing S1. In the second device region 200, active regions 36' and 38' have a second spacing S1'. The third device region 300 includes essentially the same semiconductor structure as shown in FIG. 2B, in which the active regions 136 and 138 have spacing S3. In the fourth region 400, active regions 136' and 138' have spacing S3'. Spacing S1' is smaller than spacing S1, and hence no stress-released regions are formed between the neighboring MOS devices 30' and 32'. Similarly, spacing S3' is smaller than spacing S3, and hence no stress-released regions are formed between MOS devices 130' and 132'. Preferably, throughout a stress-sensitive circuit or throughout semiconductor chip 500, for substantially all spacings between neighboring active regions smaller than a pre-determined threshold value, for example, about 0.3 µm, no stress-released STI regions are formed. Conversely, for substantially all spacings between neighboring active regions greater than the pre-determined threshold value, stress-released STI regions are formed.

Figure 4:
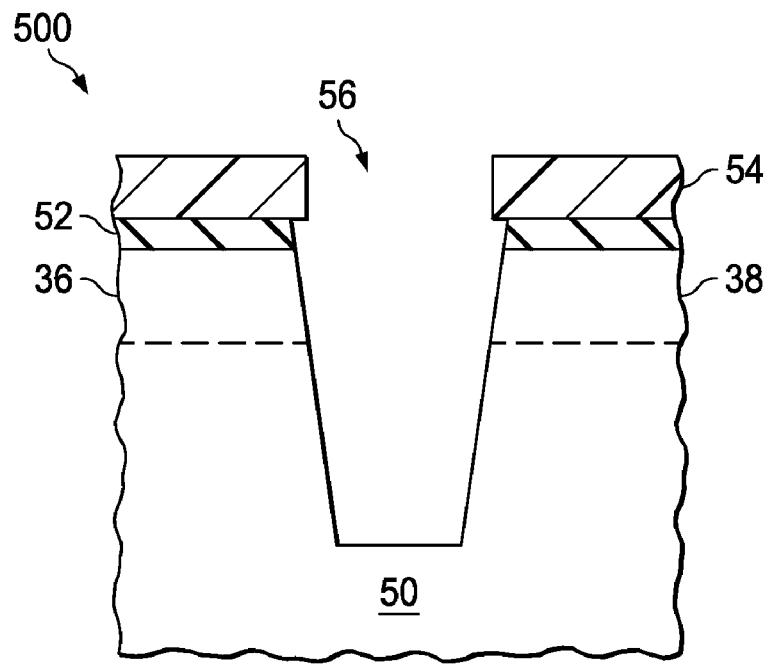
FIGS. 4 through 7 are cross-sectional views of intermediate stages in the manufacturing of the stress-released regions.
Figure 5:
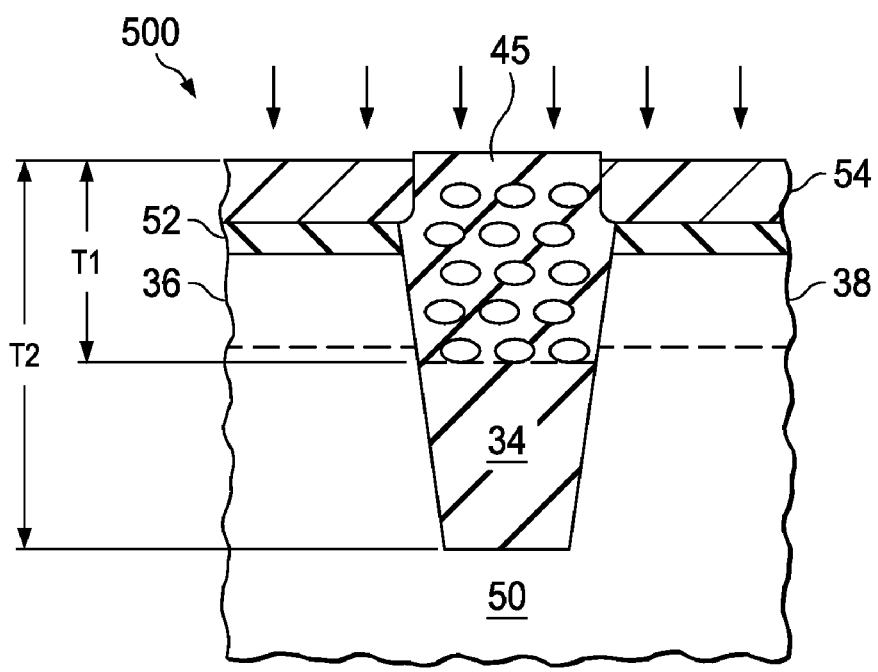

FIGS. 4 and 5 illustrate the method for forming stress-released regions 45, wherein the cross-sectional views shown in FIGS. 4 and 5 are taken along the plane crossing line A-A' in FIG. 2A. Referring to FIG. 4, substrate 50, which is in semiconductor chip 500, is provided. Substrate 50 is preferably a semiconductor substrate comprising, for example, silicon, and may be a bulk substrate, or has a silicon-on-insulator (SOI) structure. Pad layer 52 and hard mask 54 are then formed on substrate 50. Pad layer 52 may be formed of thermal oxide, while hard mask 54 may be formed of silicon nitride. Next, with the formation and patterning of a photo resist (not shown), opening 56 is formed in pad layer 52 and hard mask 54, and extending into substrate 50. Referring to FIG. 5, an oxide liner (not shown) is then formed, followed by filling a dielectric material(s) into opening 56, for example, using high-density plasma chemical vapor deposition (HDP), sub atmospheric chemical vapor deposition (SACVD), or spin on. The materials of the filling dielectric materials may include silicon oxide or spin-on glass. A chemical mechanical polish (CMP) is then performed to remove excess dielectric material over hard mask 54, forming STI region 34, as shown in FIG. 5.

Next, as also shown in FIG. 5, an implantation is performed, forming stress-released region 45 in STI region 34. Preferably, the implanted elements are heavy, so that the bonds of the materials in STI region 34 can be broken to release stresses. The implanted elements may include argon, indium, arsenic, or other elements that are heavy enough to break the bonds. The depth T1 of stress-released region 45 is preferably deeper than the channel region of MOS devices 32 and 34 (refer to FIG. 2A). More preferably, depth T1 is between 100 Å and about 1000 Å. Even more preferably, depth T1 is greater than about 30 percent of the thickness T2 of STI region 34. The dosage of the implanted elements may be between about $1 \times 10^{14}/cm^2$ and about $1 \times 10^{16}/cm^3$. The concentration of the implanted elements in stress-released region 45 is preferably greater than about $1 \times 10^{17}/cm^3$. The implantation energy may be about 2 keV to about 100 keV. The formation of stress-released region 45 as shown in FIG. 5 is referred to as a self-aligned formation, since the patterned pad layer 52 and hard mask 54 are used as masks. In this embodiment, all STI regions 34 in semiconductor chip 500 (refer to FIG. 3) may be stress-released. After the implantation, pad layer 52 and hard mask 54 are removed.

Figure 6:
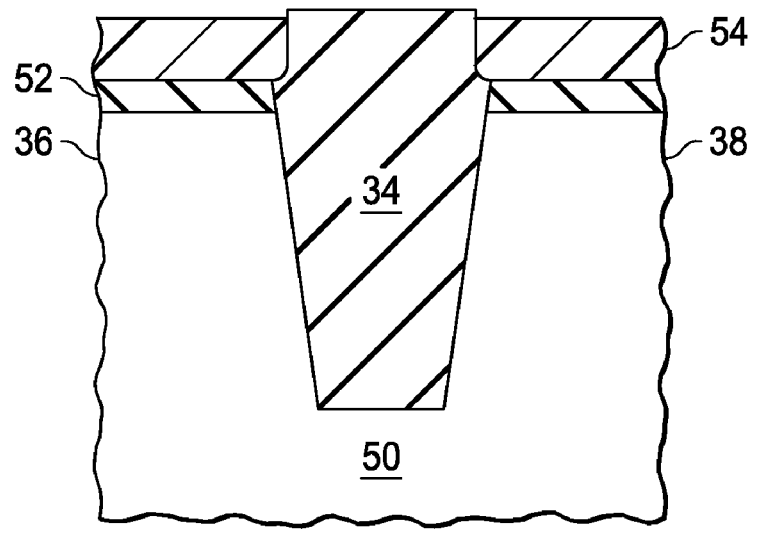
Figure 7:
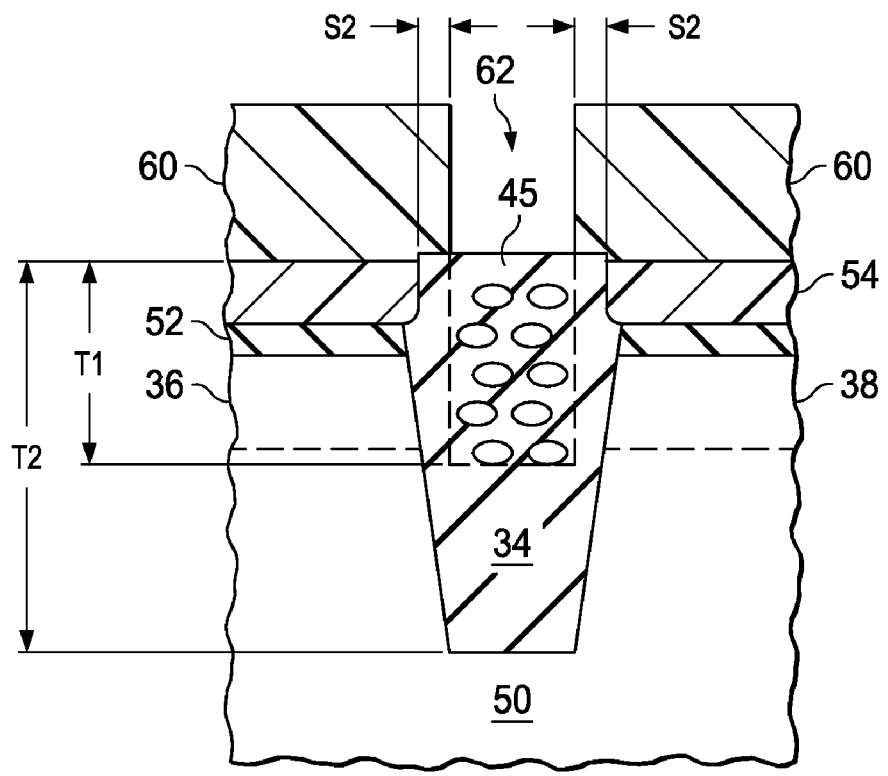

FIGS. 6 and 7 illustrate an alternative embodiment for forming stress-released region 45 in STI region 34. FIGS. 6 and 7 are cross-sectional views taken along the plane crossing line A-A' in FIG. 2A. Referring to FIG. 6, STI region 34 is formed. Next, as shown in FIG. 7, photo resist 60 is formed and patterned. Opening 62 is formed in photo resist 60, exposing STI region 34. The edges of photo resist 60 and the respective edges of active regions 36 and 38 have the spacing S2. Photo resist 60 may be formed before, or after, the removal of pad layer 52 and hard mask 54. Next, an implantation is performed. The implantation process is essentially the same as shown in FIG. 5. The resulting stress-released region 45 only occupies a top center region of STI region 34, while the remaining portions, including a lower center region directly underlying the top center region, and edge regions, of STI region 34 are still stressed.

Figure 8C:
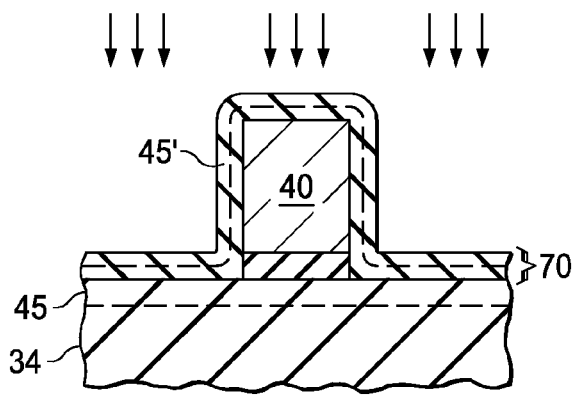
FIGS. 8A through 8D illustrate different views of an embodiment of the present invention, wherein stress-released regions are formed in stressed layers formed over MOS devices.
Figure 8A:
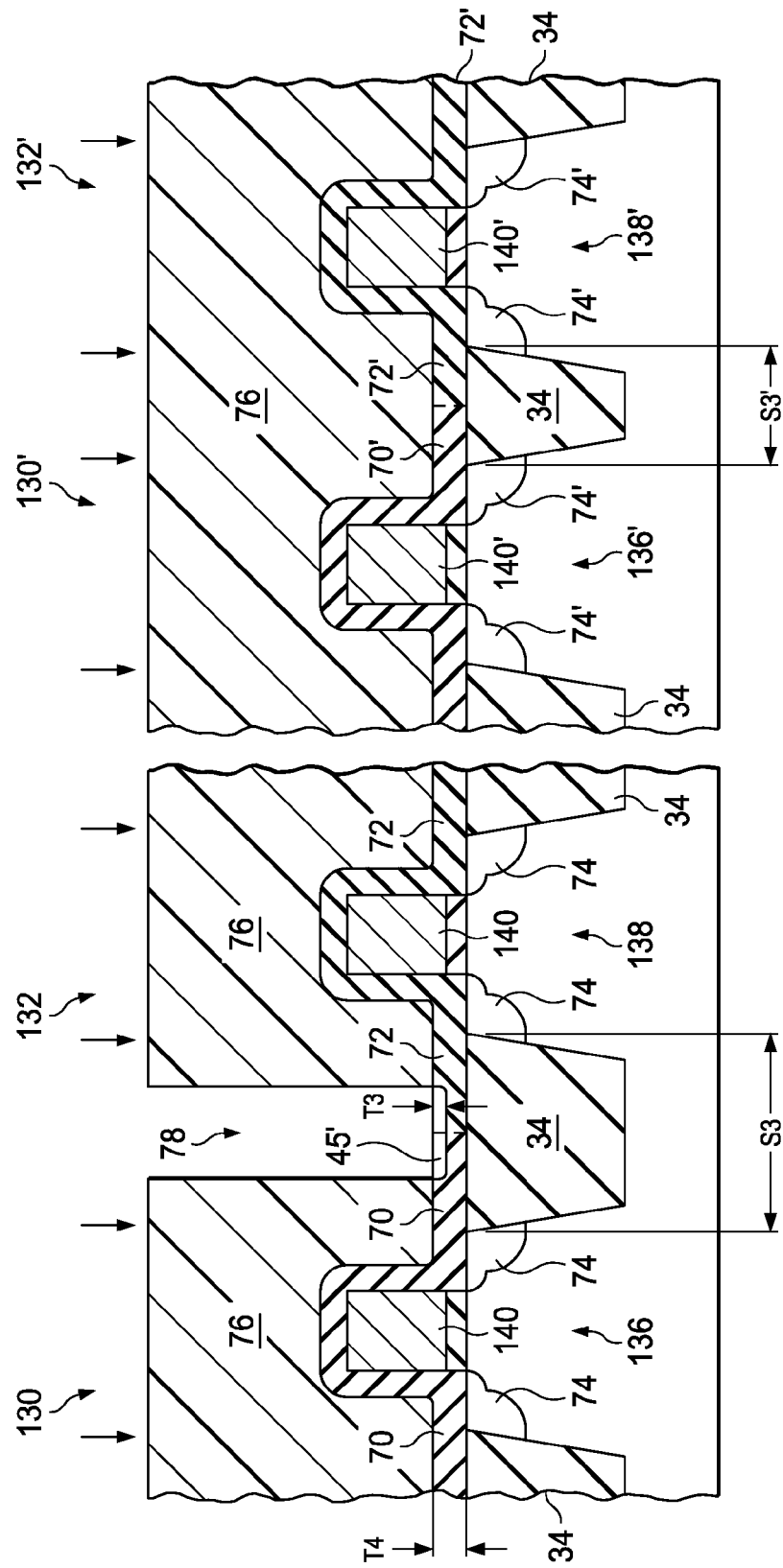
Figure 8B:
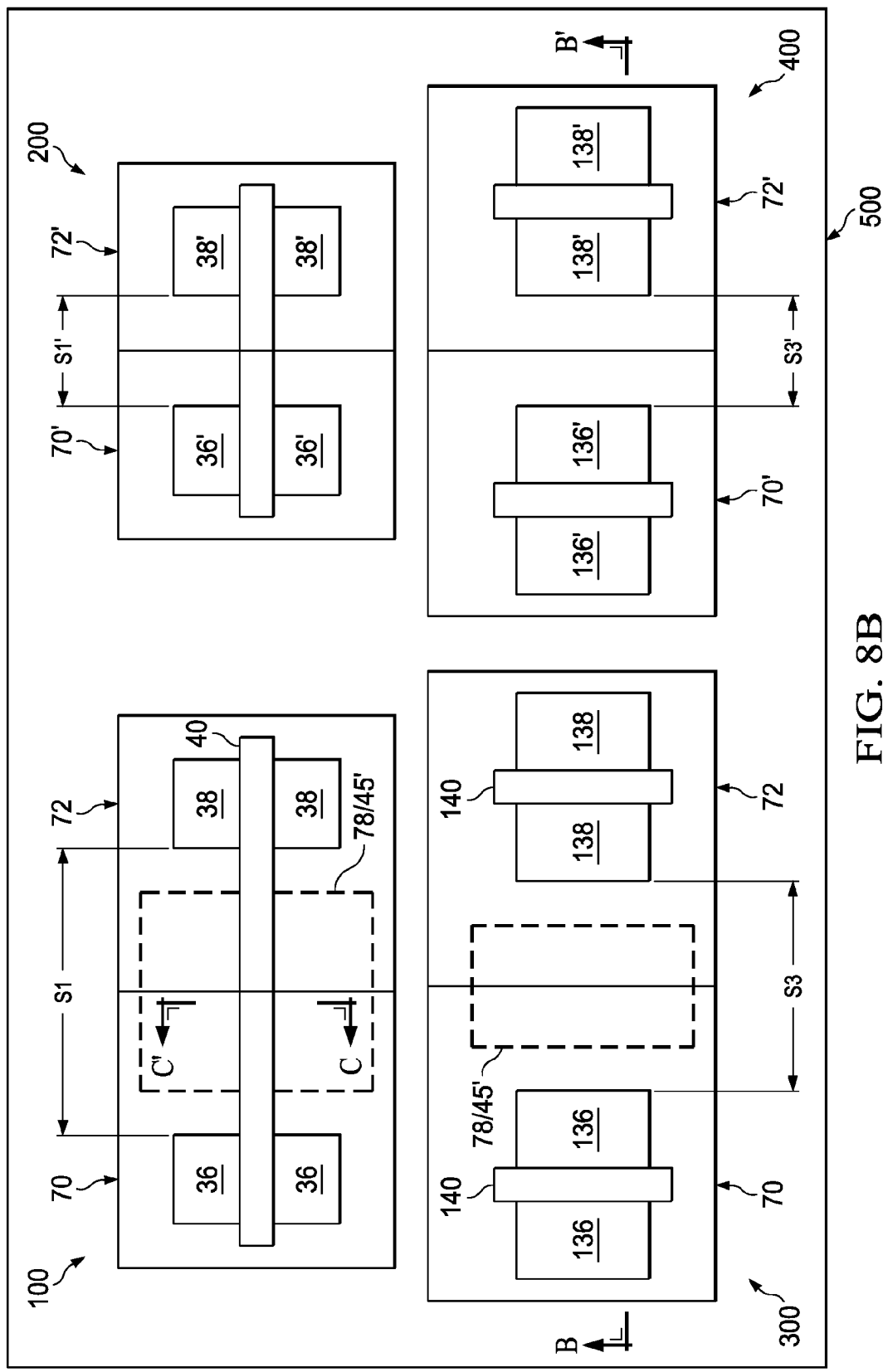

FIGS. 8A through 8C illustrate an alternative embodiment of the present invention. Referring to FIG. 8A, after the formation of MOS devices 130, 132, 130', and 132' (please also refer to FIG. 8B), stressed layers 70, 72, 70', and 72' are formed, for example, using plasma-enhanced chemical vapor deposition (PECVD). The exemplary materials include silicon nitride, silicon oxide, silicon oxynitride, and/or the like.

The thickness of stressed layers 70, 72, 70', and 72' may be between about 10 nm and about 100 nm.

In the case MOS devices 130 and 132 are of a same conductivity type, stressed layers 70 and 72 may be portions of a same stressed layer. Depending on the type of the underlying MOS devices, stressed layers 70, 72, 70', and 72' may have different combinations of tensile or compressive stresses. Again, the spacing S3 is greater than spacing S3'. Stressed layers 70, 72, 70', and 72' may be DESLs or stress memorization layers. Photo resist 76 is formed over stressed layers 70, 72, 70', and 72', wherein opening 78 is formed in photo resist 76 to expose underlying stressed layers 70 and 72. No opening is formed to expose stressed layers 70' and 72'.

Next, an implantation is performed to implant the exposed stressed layers 70 and 72, forming stress-released region 45'. Preferably, the thickness T3 of stress-released region 45' is less than the thickness T4 of each of the stressed layers 70 and 72, and more preferably less than 50 percent of thickness T4 of the stressed layers 70 and/or 72. The dosage of the implanted elements may be between about $1\times10^{14}/cm^2$ and about $1\times10^{16}/cm^3$. The concentration of the implanted elements in stress-released region 45' is preferably greater than about $1\times10^{17}/cm^3$. The implantation energy may be about 2 keV to about 50 keV.

The top view of the structure shown in FIG. 8A is shown in FIG. 8B, wherein the cross-section view in FIG. 8A is taken along a plane crossing line B-B' in FIG. 8B. The structure shown in FIG. 8B may be the resulting structure after more process steps are performed on the structure shown in FIG. 3. Similar to the embodiment as shown in FIG. 3, preferably, throughout a stress-sensitive integrated circuit or throughout semiconductor chip 500, the stressed layers 70 and 72 in spacings S1/S3 greater than about a pre-determined threshold spacing are implanted, and hence the stresses in the stressed layers are relaxed, while the stressed layers 70' and 72' in spacings S1'/S3' smaller than about the pre-determined threshold spacing are not implanted. Since the stressed layers apply stresses to the channel regions of the underlying MOS devices, the implantation results in more uniform stresses in the channel regions of the MOS devices, and hence more uniform drive currents.

Figure 8D:
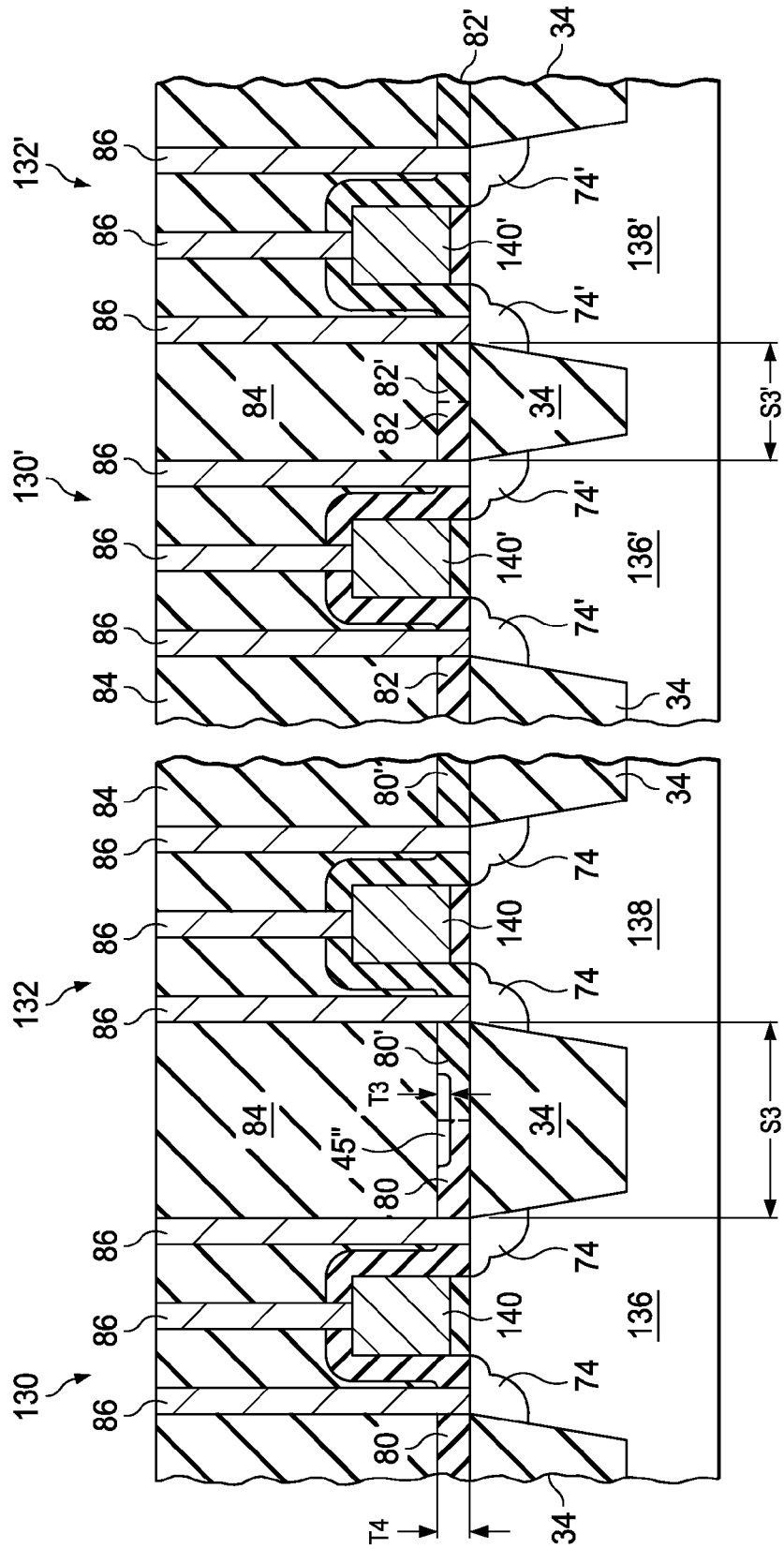

Referring back to FIG. 8A, in the case the stressed layers 70, 72, 70', and 72' are stress memorization layers, after the implantation, an anneal, for example, at between about 800° C. and about 1100° C. is performed. The stresses in the stressed layers 70, 72, 70', and 72' are thus transferred to the underlying source/drain regions 74 and 74', gate electrodes 140 and 140'. In FIG. 8D, the stressed layers 70, 72, 70', and 72' are removed. Then, gate silicides and source/drain silicides may be (not shown) formed, followed by the formation of DESL layers 80, 80', 82, and 82'. Like the stressed layers 70, 72, 70', and 72', DESL layers 80, 80', 82, and 82' may have different combinations of tensile or compressive stresses. Similar to the formation of stress-released region 45' in FIG. 8A, stress-released region 45'' may be formed by implantation in DESL layers 80, 80', 82, and 82', as shown in FIG. 8D. Next, an inter-layer dielectric (ILD) 84, and contact plugs 86 are formed. In the case stressed layers 70, 72, 70', and 72' are DESLs, ILD 84 may be formed on stressed layers 70, 72, 70', and 72', followed by the formation of the contact plugs.

FIG. 8B also illustrates the stress-released regions formed between active regions 36 and 38, but not between active regions 36' and 38', which is similar to the case shown in FIG. 3.

FIG. 8C illustrates an additional cross-sectional view of the structure as shown in FIG. 8B, wherein the cross-sectional view is taken along a plane crossing line C-C' in FIG. 8B. It shows that the stress-released region 45' is preferably limited in the region directly over STI region 34. Further, an additional stress-released region 45 may also be formed in the STI region 34 and directly under the stress-released region 45'.

Please note that in the embodiments of the present invention, stress-released regions 45/45' may be formed in STI regions, in stress memorization layers, and DESL layers, with different combinations. Further, the stress-released regions 45/45' may be formed for different combinations of devices and/or circuits. For example, in an embodiment of the present invention, the stress-released regions are formed between only PMOS devices, but not NMOS, or vise versa. In other embodiments, the stress-released regions are formed between the MOS devices in core circuits, but not between the MOS devices in memory circuits, or vise versa. In yet other embodiments of the present invention, the stress-released regions are formed between the MOS devices in the core circuits, but not between the MOS devices in input/output (IO) circuits, or vise versa.

The embodiments of the present invention have several advantageous features. By forming stress-released regions in stressed regions, the stressed regions may apply uniform stresses to the adjacent (or adjoining) MOS devices; the performance drift (for example, drive current drift) is thus minimized. Accordingly, there is not need to compensate for the performance drift in simulations of the integrated circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
    a semiconductor substrate;
    a first active region in the semiconductor substrate; and
    a shallow trench isolation (STI) region extending from a top surface of the semiconductor substrate into the semiconductor substrate, wherein the STI region comprises:
        a first surface portion doped with a doping element and having a first inherent stress; and
        a second surface portion substantially free from the doping element, having a second inherent stress greater than the first inherent stress, wherein the first active region and the first surface portion are on opposite sides of, and are in contact with, the second surface portion.

2. The device of claim 1 further comprising a second active region in the semiconductor substrate, wherein the first active region and the second active region are on opposite sides of the STI region.

3. The device of claim 2, wherein the STI region further comprises a third surface portion having a third inherent stress greater than the first inherent stress, wherein the second active region and the first surface portion are on opposite sides of, and are in contact with, the third surface portion.

4. The device of claim 1 further comprising a gate electrode strip over and crossing the first active region in a top view of the device, wherein the gate electrode strip is directly over the first surface portion and the second surface portion of the STI region.

5. The device of claim 1, wherein a distance between the first active region and the first surface portion is smaller than about 100 Å.

6. The device of claim 1, wherein the STI region further comprises a bottom portion having an inherent stress greater than the first inherent stress, wherein the bottom portion is underlying and aligned to the first surface portion.

7. The device of claim 1, wherein the element is selected from the group consisting essentially of argon, indium, arsenic, and combinations thereof.

8. The device of claim 1, wherein the STI region further comprises bottom portion having underlying and aligned to the first surface portion, wherein the bottom portion is substantially free from the element.

9. The device of claim 1, wherein the element in the first portion of the STI region has a concentration greater than about $1\times10^{17}/cm^3$.

10. A semiconductor device, comprising:
a semiconductor substrate;
a first active region in the semiconductor substrate; and
a shallow trench isolation (STI) region extending from a top surface of the semiconductor substrate into the semiconductor substrate, wherein the STI region comprises:
a first surface portion having a first inherent stress; and
a second surface portion having a second inherent stress greater than the first inherent stress, and separating the first active region and the first surface portion;
wherein a distance between the first active region and the first surface portion is smaller than about 100 Å.

11. The device of claim 10, wherein the first surface portion is doped with an element, and wherein the second surface portion is substantially free from the element.

12. The device of claim 10 further comprising a second active region in the semiconductor substrate, wherein the first active region and the second active region are on opposite sides of the STI region.

13. The device of claim 12, wherein the STI region further comprises a third surface portion having a third inherent stress greater than the first inherent stress, wherein the second active region and the first surface portion are on opposite sides of, and are in contact with, the third surface portion.

14. A semiconductor device, comprising:
a semiconductor substrate; and
a plurality of device regions, each device region comprising:
a first active region;
a second active region separated from the first active region by a first spacing (S1);
a shallow trench isolation (STI) region extending from a top surface of the semiconductor substrate into the semiconductor substrate, disposed between and adjacent to the first active region and the second active region;
a first STI surface region doped with a doping element, and having a first inherent stress, and disposed in the STI region between the first active region and the second active region and having a first width (W1); and
a second STI surface region substantially free of the doping element, and having a second inherent stress greater than the first inherent stress, and disposed in the STI region, a portion of the second STI surface region disposed between and separating the first active region and the first STI surface portion by a second spacing (S2), and a portion of the second STI surface region disposed between and separating the second active region and the first STI surface portion by the second spacing (S2);
wherein the second spacing (S2) of a first device region and the second spacing (S2) of a second device region are substantially constant.

15. The device of claim 14, wherein the first spacing (S1) of the first device region and the first spacing (S1) of the second device region are different.

16. The device of claim 14, wherein the first spacing (S1) is equal to the second spacing (S2) multiplied by two and added to the first width (W1).

17. The device of claim 14, wherein the second spacing (S2) is less than about 100 Å.

* * * * *